United States Patent [19]
Lin et al.

[11] Patent Number: 5,126,971
[45] Date of Patent: Jun. 30, 1992

[54] THIN FILM MAGNETIC CORE MEMORY AND METHOD OF MAKING SAME

[75] Inventors: Fong-Jei Lin; Shengbo Zhu, both of San Jose, Calif.

[73] Assignee: Magnex Corporation, San Jose, Calif.

[21] Appl. No.: 455,070

[22] Filed: Dec. 22, 1989

[51] Int. Cl.$^5$ .................... G11C 11/14; H01F 17/06
[52] U.S. Cl. .................... 365/171; 365/173; 360/123; 360/126; 336/83; 336/200
[58] Field of Search .................... 336/83, 200, 232; 365/171, 173; 360/123, 126

[56] References Cited

U.S. PATENT DOCUMENTS

| | | | |
|---|---|---|---|
| 3,375,503 | 3/1968 | Bertelsen | 365/171 |
| 4,689,592 | 8/1987 | Walker | 336/83 |
| 4,887,236 | 12/1989 | Schloemann | 365/173 |

*Primary Examiner*—Joseph A. Popek
*Attorney, Agent, or Firm*—Townsend & Townsend

[57] ABSTRACT

A thin film magnetic core array has a large number of individual thin film core memory elements arranged on a substrate with X, Y, Z and SENSE conductor leads reeving through the core elements between contact pads arranged about the periphery of the array. Each thin film magnetic memory element includes a bottom pole, a top pole forming a closed magnetic path with the top pole, the structure surrounding the leads passing through the core, and insulation material for electrically insulating the leads from each other and from the pole pieces. The SENSE lead from the array is coupled to a miniature thin film transformer which amplifies the signals read from the individual core elements. The transformer has a bottom pole, a top pole forming a closed magnetic path with the bottom pole, including a central leg extending between the top and bottom poles, and a pair of electrically conductive coils mutually spaced in the region between the top and bottom poles.

39 Claims, 6 Drawing Sheets

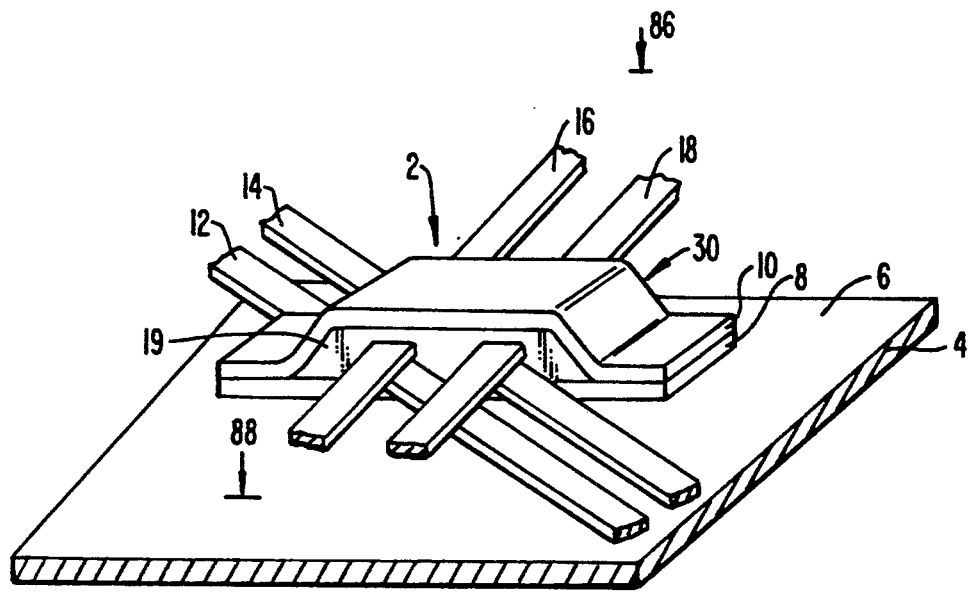
FIG._1.
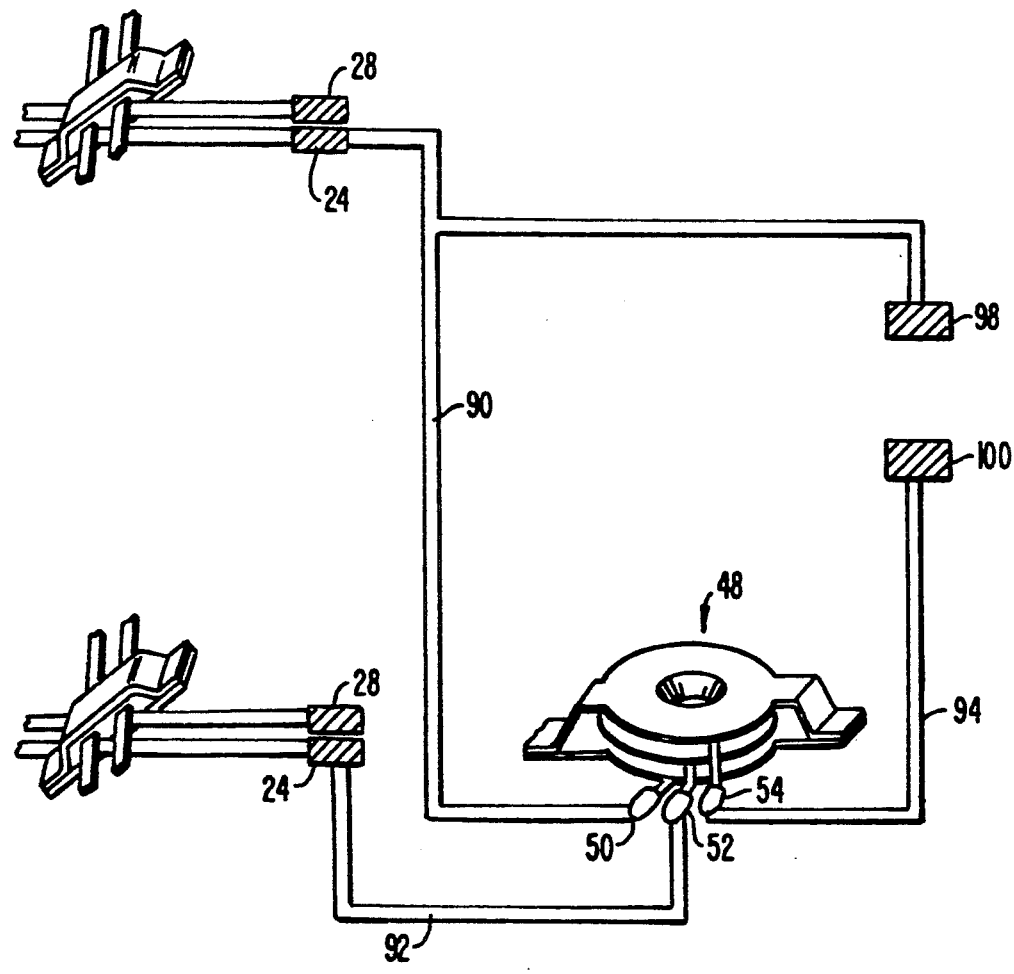
FIG._10.

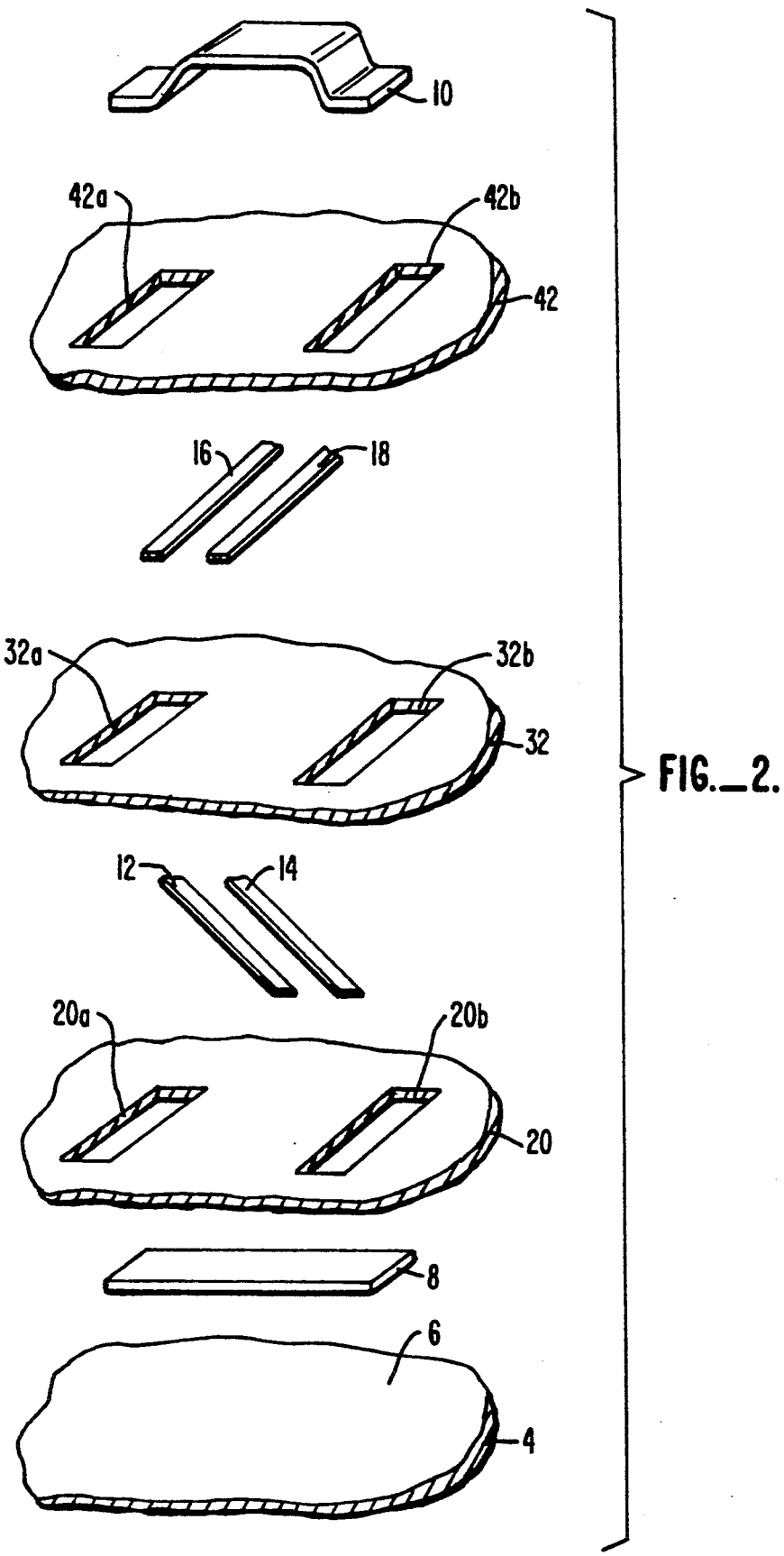

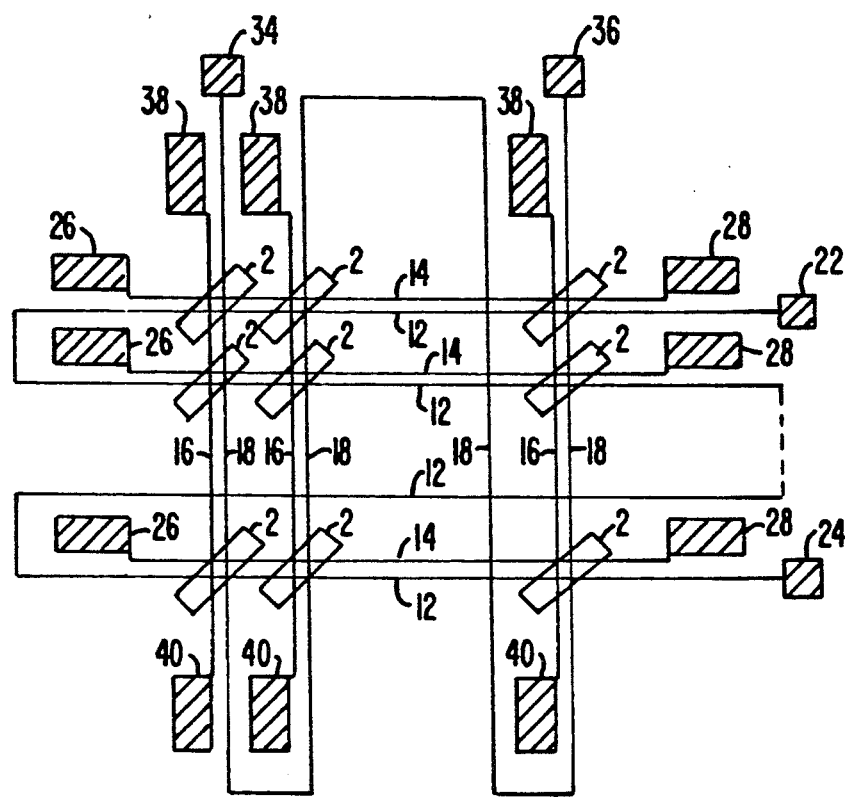
FIG._3.
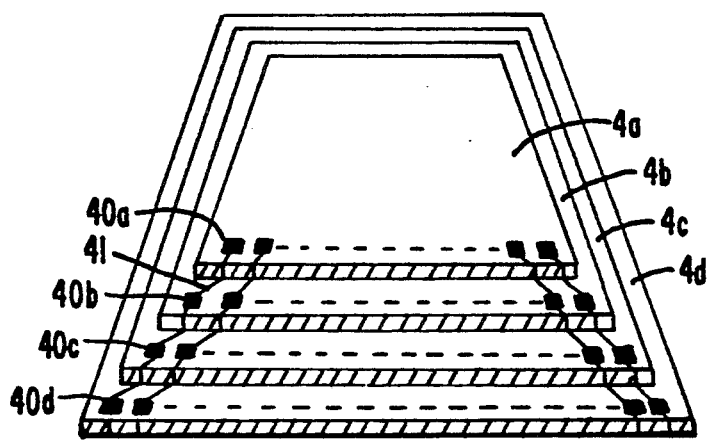
FIG._4.

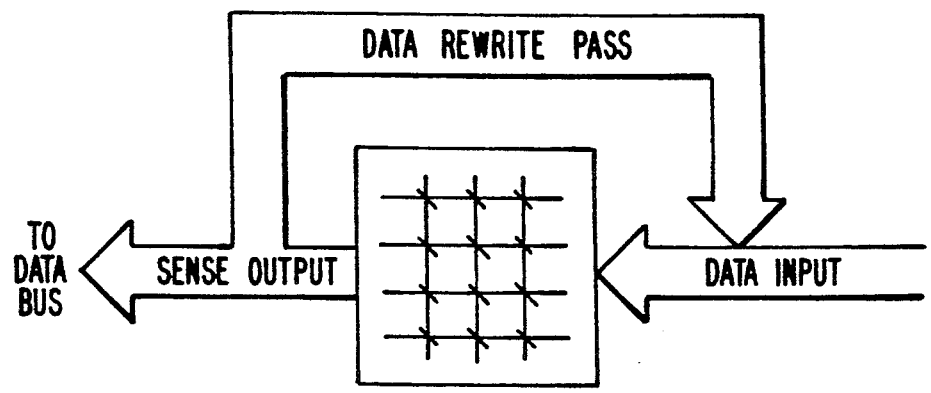
FIG._5.
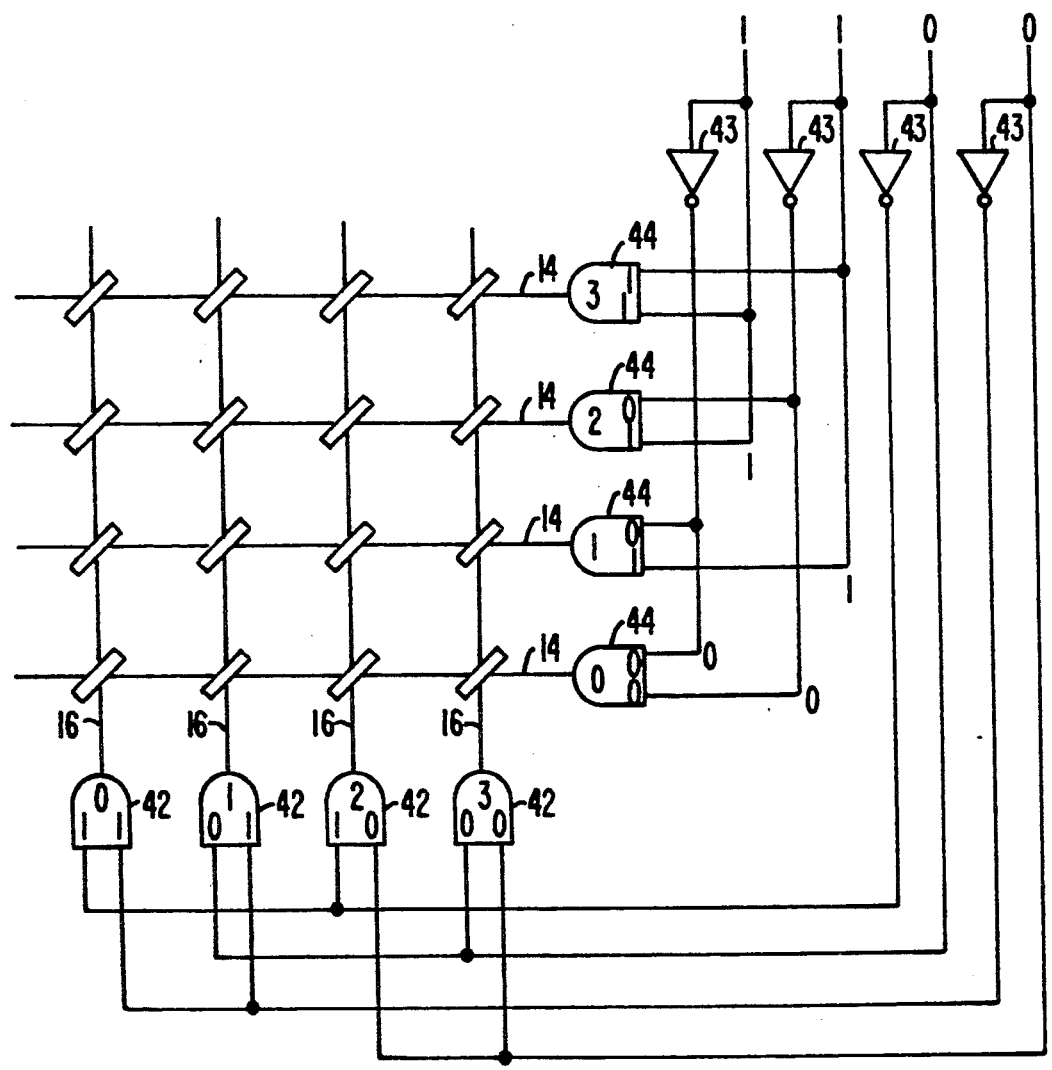
FIG._6.

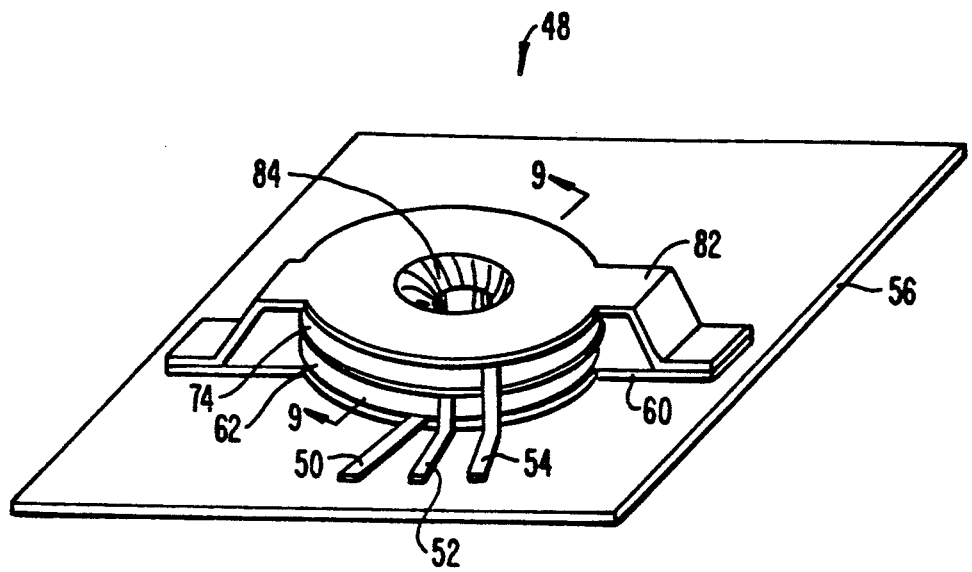
FIG._7.
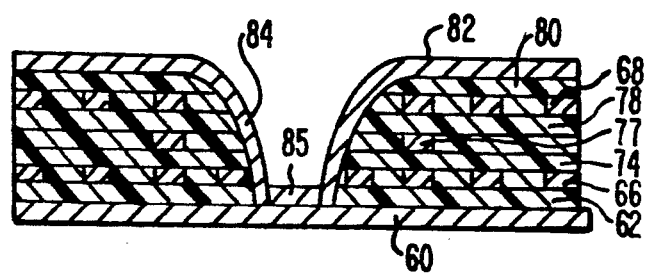
FIG._9.

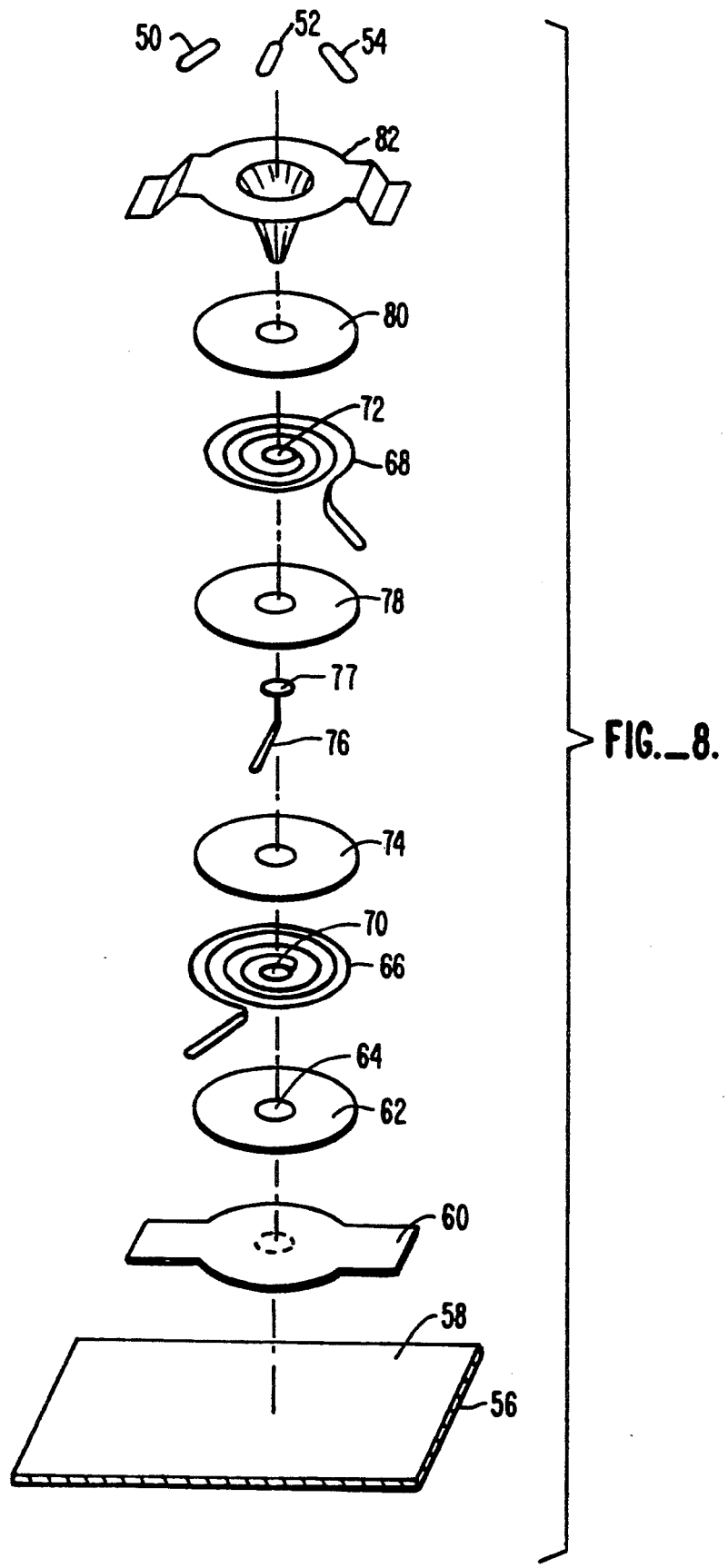
FIG._8.

THIN FILM MAGNETIC CORE MEMORY AND METHOD OF MAKING SAME

BACKGROUND OF THE INVENTION

This invention relates to magnetic memory elements of the type used to store and retrieve bits of data and to methods of fabricating the same.

The mass storage device most commonly used today in the computer industry is the disk drive. In a disk drive, data is stored in magnetic form on a rigid or flexible recording disk and is both stored and retrieved by means of one or more magnetic inductive transducer heads mounted on a mechanically translatable art. Data is stored in addressable sectors of concentric tracks, the addresses being recorded magnetically in appropriate locations. Because of the electromechanical nature of a disk drive, the speed with which data can be stored and retrieved is correspondingly limited. In spite of this limitation, and the additional limitations of any mechanical system involving friction and mass, the disk drive remains the most popular mass storage device in use today.

Prior to the development of relatively high capacity disk drive units, ferrite core memory arrays were widely used for mass storage in computer systems. A ferrite core memory system employs a plurality of planes of individual ferrite magnetic core elements and individual address and sense conductors used to isolate a single core element and either write or read information from that particular core element, with the aid of addressing gates. Although initially useful and an improvement over rotating magnetic drum memory systems, ferrite core memory systems suffer from several disadvantages. Firstly, a ferrite core memory system consumes a relatively large amount of electrical power during operation due to the relatively large drive current required for ferrite core magnetization and the relatively large voltage required for switching the magnetic flux found within the individual cores. Further, because operation of each core requires flux switching, substantial amounts of hysteretic heat are generated during use. In addition, the access speed of a ferrite core memory is relatively slow compared to present day disk drive units due to the relatively large drive current and large voltage noted above. Still further, a ferrite core memory system has an extremely small memory capacity when compared to a present day disk drive unit due to the relatively large physical size of each individual core element, when compared to the physical space on a memory disk required to store a given bit of information. Due to these disadvantages, ferrite core memory systems have been largely abandoned, except in certain computer system applications in which the high reliability of a ferrite core overcomes the above noted cost and performance limitations.

Attempts have been made to design practical magnetic memory systems devoid of the disadvantages of both ferrite core memory and disk drives. One such attempt is in the field of thin film memory systems, in which thin films of magnetic material are formed in an intersecting grid pattern using photolithographic techniques of the type employed in the fabrication of integrated circuits. In such thin film memory arrays, information is written into and read from the individual elemental sites to different combinations of electrical current usually pulsed through electrically conductive layers deposited on or sandwiched between the magnetic grid lines. Another attempt to provide a suitable mass storage array using integrated circuit photolithographic fabrication techniques employs crossing strips of magnetoresistive materials arranged in a grid pattern along with overlying electrically conductive sense lines which are insulated from the magnetoresistive elements. In such devices, the state of magnetization of a given site is measured by the value of standard electrical current passed through the sensing lines. Although much effort has been devoted to the attempted miniaturization of mass storage elements comparable in both physical size and performance to a magnetic disk drive, such attempts have not been successful.

SUMMARY OF THE INVENTION

The invention comprises an improved thin film magnetic core memory element and system which is devoid of the above-noted disadvantages and which provides relatively dense storage capability with low power consumption and extremely high reliability.

The individual thin film magnetic core memory element comprises a bottom pole member supported by a suitable substrate, a top pole member forming a closed magnetic path with the bottom pole member, the pole members fabricated of a magnetically permeable material, a plurality of electrically conductive leads passing through the interior of the magnetic path, and means for electrically insulating the leads from each other and from the base and top pole members. The electrically conductive leads are grouped into first and second pairs of substantially mutually parallel leads, with one group being arranged at an angle with respect to the other group.

A planar array of such individual thin film magnetic memory core elements has the individual core elements arranged in a predetermined pattern, and the electrically conductive leads arranged as mutually parallel row array leads, mutually parallel column array leads, a continuous Z lead reeving through the individual core elements in a first predetermined pattern, and a SENSE lead reeving through all the core elements in a second predetermined pattern. The Z lead and group of X leads are mutually parallel; while the Y and SENSE leads are mutually parallel and arranged at right angles to the X and Z leads. A plurality of contact pads are arranged about the periphery of the array, and the individual leads are coupled to the pads in a predetermined pattern so that the individual core elements can be addressed by suitable address signals generated externally of the device.

A miniature thin film transformer is provided in order to modify the signal generated on the sense line during a read of a given core element in order to boost the voltage of the output signal. The thin film transformer comprises a bottom pole member, a top pole member forming a closed magnetic path with the bottom pole member, the top and bottom pole members fabricated of a magnetically permeable material; an electrically conductive coil structure positioned between the top and bottom pole members; and means for electrically insulating the coil structure from the pole members. The coil structure comprises a pair of mutually spaced individual electrically conductive coils, and a center tap element connected to one end of each of the coils. The other end of the coils and the tap element are formed to be externally accessible and are preferably coupled to contact pads positioned outside of the transformer structure. The closed magnetic path is formed between the top and bottom pole members at respective ends thereof, and also centrally thereof to means of a central portion of the top pole member which extends to the central portion of the bottom pole member. The transformer can be located on the same substrate as the memory array, or may be formed as a separate unit.

Both the core memory array and the thin film transformer are fabricated using integrated circuit fabrication techniques to provide the structure described above. The physical dimensions of the individual memory elements are relatively small so that memory arrays can be constructed which have relatively high bit capacity, low power consumption, and extremely short access time when compared to prior art disk drives and magnetostrictive devices. In addition, since the individual memory core elements employ closed magnetic paths, the problem of stray magnetic fields and cross field interaction encountered in thin film memory elements is solved, and the elements provide long term non-volatility of bit storage in an exceedingly reliable fashion. Further, the arrays can be fabricated with great economies of scale using integrated circuit techniques, so that individual memory arrays can be produced at a favorably low cost with relatively high yield.

For a fuller understanding of the nature and advantages of the invention, reference should be had to the ensuing detailed description taken in conjunction with the accompanying drawings.

BRIEF DESCRIPTION OF THE DRAWINGS

FIG. 1 is an idealized perspective view of a single thin film memory element constructed in accordance with the present invention;

FIG. 2 is an exploded perspective view illustrating the memory element of FIG. 1;

FIG. 3 is an idealized top view of a thin film magnetic core array layout on a substrate;

FIG. 4 is an idealized perspective view of a multi-substrate three dimensional thin film magnetic core memory system;

FIG. 5 is a diagram illustrating the read/write operation for an array of magnetic core elements;

FIG. 6 is a logic diagram illustrating random access addressing of an array of magnetic core elements;

FIG. 7 is a idealized perspective view of a thin film transformer constructed in accordance with the present invention;

FIG. 8 is an exploded perspective view of the transformer of FIG. 5;

FIG. 9 is a sectional view taker along lines 9—9 of FIG. 7; and

FIG. 10 is an enlarged detail view illustrating a transformer coupled to the sense line of a single memory plane.

DETAILED DESCRIPTION OF THE DRAWINGS

Turning now to the drawings, FIG. 1 and FIG. 2 illustrate a thin film magnetic core element fabricated in accordance with the teachings of the invention. As seen in these FIGS., a core element generally designated with reference numeral 2 is formed on a substrate 4. Substrate 4 may comprise any one of several suitable materials such as glass, silicon, alumina ($A\lambda_2O_3$), alumina-titanic-carbide ($A\lambda_2O_3TiC$) or the like. The thickness of substrate 4 as well as the size will vary in accordance with the particular manufacturing specifications.

By way of example only, in one form of construction the thickness will be on the order of 15 mils and the length and width will be about 2 inches and 2 inches, respectively.

Thin film magnetic core element 2 includes a bottom pole piece 8 and a top pole piece 10 fabricated from a suitable magnetically permeable material, such as nickel-iron or the like. The two pole pieces 8, 10 provide a closed core magnetic structure which encloses four individual electrically conductive leads 12, 14, 16 and 18 which are all electrically insulated from one another by means of insulative material generally designated in FIG. 1 with reference numeral 19. As will be seen, insulating layer 19 comprises several layers of electrically insulative material which are successively deposited in the manner described below to result in composite layer 19.

Conductive leads 12, 14, 16 and 18 form, respectively, the sense conductor, the Y address conductor, the X address conductor and the Z address conductor. These leads are required in order to individually address the core element 2 in an array, as discussed more fully below, and to read data from or write data into an individually addressed core element.

With reference to FIG. 2, fabrication of the core element 2 is performed using conventional integrated circuit fabrication techniques involving successive deposition of various layers, patterning, and etching of the various thin film layers progressing upwardly from the deposition surface 6 of substrate 4. Various deposition methods can be used, such as sputtering and plating, PVD, CVD, and ion plating. The first step in the process for producing the core element 2 is the deposition on the substrate of a suitable insulative layer, such as silicon dioxide ($SiO_2$), alumina or the like in order to provide a surface free of electrical conductivity and magnetic susceptibility. Bottom pole piece or bar 8 is next deposited and finally defined by selected photomask patterning and etching steps using well known techniques. The bottom bar 8 is preferably formed by the deposition of a suitable magnetically permeable material, such as nickel-iron, to a prescribed thickness, e.g., 0.1 micron and a length and width of 500 $\mu$ inches and 200 $\mu$ inches, respectively. Next, the first insulation layer 20 is formed by applying a photoresist coating, after which the contours of insulation layer 20 are determined by photomask patterning and solidification of the coating to a thickness on the order of 3 microns, with apertures 20a and 20b formed therein in order to expose portions of bottom bar 8 for ultimate contact with similar portions of top pole piece or bar 10. First insulation layer 20 may be formed from silicon dioxide, alumina, photoresist or any other similar electrically insulative materials. After formation of the first insulation layer 20, a first thin film seed layer (not shown) is deposited which consists of electrically conductive material, e.g., copper, silver or gold, which provides a good bonding surface for subsequent plating of conductive leads 12, 14. This seed layer is deposited in a thickness on the order of 200 Å with an overlay of the sensor lead 12 and Y lead 14 as ultimately defined by selected photomask patterning end platethrough, followed by the steps of a photoresist strip and a seed layer etch. The sensor lead 12 and Y lead 14 are next formed over the seed layer using a suitable electrically conductive material, such as copper, after which a second insulation layer 32 is produced in a manner identical to that already described for first insulation layer 20. Second insulation layer 32 includes apertures 32a and 32b in registration with apertures 20a, 20b of first insulation layer 20, for the same purpose. Next, the second thin film seed layer (not shown) is deposited, followed by the deposition of X lead 16 and Z lead 18 in a manner identical to that used to create sense lead 12 and Y lead 14. There follows the creation of the third insulation layer 42, which is processed in the same manner as the first and second insulation layers 20, 32 and which is provided with apertures 42a, 42b. The top pole piece or bar 10 is next deposited using selected photomask patterning and etching techniques and by depositing a magnetically permeable material to a predetermined thickness, e.g., 0.1 micron and a length and width matched to bottom bar 8. Since the bottom bar 8 and top bar 10 are formed in physical contact at the ends thereof (via apertures 20a, 32a, 42a; and 20b, 32b, 42b), these elements form a closed magnetic loop. After formation of the top bar 10, a protective layer (not shown) is deposited to cover the now formed magnetic core element 2, the protective layer comprising a suitable electrically insulative material such as silicon dioxide, alumina or the like.

While the fabrication of the thin film magnetic core element has been described with reference to a single such element, as will be appreciated by those skilled in the art, many such elements can be simultaneously fabricated to create a planar array of individual core elements, such as the array depicted in FIG. 3. In the fabrication of such an array, the individual process steps are as described above. However, multiple core element components are created during each step of the process, and the electrically conductive leads are created such that the individual core elements 2 are interlinked in the manner shown in FIG. 3. In particular, the sense conductor 12 reeves through each of the magnetic core elements 2 in serpentine fashion, extending from externally accessible contact pad 22 to contact pad 24. Similarly, the Z lead 18 reeves through each of the individual magnetic core elements 2 in serpentine fashion between externally accessible contact pad 34 and contact pad 36. A plurality of Y leads 14 each extend through the commonly associated magnetic core elements 2 for a given Y lead. More particularly, the uppermost Y lead 14 extends between the uppermost pair of contact pads 26, 28; the lowermost Y lead 14 extends between the lowermost pair of contact pads 26, 28; etc. In a similar fashion, each X lead 16 extends between a dedicated pair of contact pads 38, 40 and reeves through associated ones of the core elements 2. The contact pads 22, 24, 26, 28, 34, 36, 38 and 40 are arranged substantially about the periphery of each planar array in order to facilitate electrical connection with other arrays and circuitry external to the individual memory array planes. As suggested by FIG. 4, a plurality of planar arrays formed on individual substrates 4a, 4b, 4c and 4d may be physically stacked on top of one another to form a physical three dimensional array, with corresponding con&act pads from each array electrically coupled together by means of the common electrical connection 41 illustrated in FIG. 4 for contact pads 40a, 40b, 40c and 40d. In this way, the total memory capacity can be sized to accommodate a particular application.

In the thin film magnetic core memory array illustrated in FIG. 3, the well known coincidental current technique is employed to write data into a given core element 2 and to read data from a given core element 2. For example, when the currents in the X, Y and Z leads 16, 14 and 18 all flow in the same direction through a given core element 2, the equation for the magnetic flux density B created within the closed magnetic path formed by pole pieces 8, 10 is:

$$B = \mu(i_x + i_y + i_z)$$

By controlling the currents so that each current has the same magnitude $i_O$, the maximum current which can flow through a given core is $3i_O$. By controlling the magnitude of $i_O$, and the magnetic parameters of each core, the minimum current capable of generating sufficient flux to be able to switch the direction of magnetization of the core which was originally magnetized in the opposite direction can be set $2i_o$ (e.g. 2.5 $i_o$). Consequently, only a total current equal to or greater than 2.5 $i_O$ will be able to switch the magnetization direction of the core which was originally magnetized in the opposite direction. With such a boundary condition, all three currents must flow through the given core in the same direction at the same time in order to generate enough flux to reverse the direction of magnetization in the previously magnetized core originally magnetized in &he opposite direction. Because the core is made from a magnetically permeable material and is a closed magnetic path, once magnetized the magnetization remains when the current is terminated. Thus, the state of magnetization of the core is non-volatile. The direction of magnetization can be reversed by reversing the direction of all three currents flowing through the core. By utilizing this switchable characteristic, the magnetic state of the core can be used to represent the binary bits 0 and 1 by simply controlling the direction of the current in those wires which pass through the cores.

To read data from a given core, the same coincidental technique is employed. Three currents ($i_x$, $i_y$ and $i_z$) are sent through a given core element 2 coincidentally in the same direction as for writing a 0 bit. If the core is in the 0 state, no switching in the magnetization direction occurs. If the core is in the 1 bit state, the direction of magnetization of the core will switch upon the passage of three currents through the core coincidentally. The magnetization direction change in the core will cause a magnetic flux change, which will then induce a voltage in the sense lead 18 according to the well known Faraday's law of induction. This induced voltage is then carried to the output terminal of the array (contact pad 24, FIG. 3) through the sense lead 12. In order to render the reading cf the 1 bits non-destructive, a feedback rewrite technique such as that illustrated in FIG. 5 is employed. In particular, the sense output signals are fed back to the data input side of the magnetic memory array to rewrite the data into the memory array.

FIG. 6 illustrates the manner in which individual magnetic cell elements can be addressed in the X-Y plane. As seen in this FIG., a plurality of address gates 42 receive address information both directly and via inverters 43, and the outputs of these gates are used to enable individual ones of the X leads 16. Similarly, a second plurality of address gates 44 drive the Y leads 14. As will be appreciated by those skilled in the art, a third array of gates will be used for Z lead selection. The address gates 42, 44 and inverters 43, as well as the Z lead gates, may be physically incorporated into the array structure, or may comprise independent elements, as desired.

FIGS. 7–9 illustrate a thin film transformer which has been found particularly useful in providing a modified output signal from the sense lead 12 of a given array. As seen in these FIGS., the transformer generally designated with reference numeral 48 is fabricated using thin film processing steps of the type already described above in connection with the fabrication of the memory elements 2 in order to provide a thin film transformer element 48 on a substrate 56, which may be the same substrate 4 on which the memory element arrays are produced or an independent substrate, depending on the application. As seen in FIGS. 7 and 8, the transformer element 48 includes a bottom magnetic pole or bar 60, an upper magnetic pole or bar 82 joined to lower bar 60 at the edges and the center thereof, a pair of electrically conductive coils 66, 68, an electrically conductive center tap element 76 and a plurality of electrically insulative spacers 62, 74, 78 and 80. The lower coil 66 is coupled to a first contact pad 50; the center tap element 76 is coupled to a second contact pad 52; and coil 68 is coupled to a third contact 54.

As best seen in FIG. 9, upper magnetic bar 82 has a central downwardly depending portion 84 generally cylindrical in configuration which passes through the central apertures 70, 72 in coil elements 66, 68, and through central aperture 77 in center tap element 76. Central element 84 terminates in a bottom portion 85 which directly contacts the bottom magnetic bar 60 in order to provide a closed magnetic path therebetween. Central portion 84 is electrically insulated from the coil elements 66, 68 and center tap element 76. As can be appreciated by those skilled in the art, transformer 48 is fabricated using conventional integrated circuit fabrication techniques similar to those already described with reference to the magnetic core elements 2. In particular, substrate 56 is initially provided, after which bottom pole 60 is formed by initial deposition of a suitable magnetically permeable material such as nickel-iron to a prescribed thickness, e.g., 3 microns, followed by selected photomask patterning and etching. Next, the first insulation layer 62 is formed by depositing an insulation layer, such as silicon dioxide, followed by photomask patterning and etching. Alternatively, a photoresist layer is coated onto the bottom pole 60 and substrate 56 followed by photomask patterning and hard bake (solidification). Next, the first coil 66 is fabricated from a suitable conductive material, such as copper, silver, gold or the like by first depositing a thin film seed layer to a thickness on the order of 200 Å, followed by the deposition of the conductive material to a suitable thickness on the order of about 3 microns, and photomask patterning, soft bake and plating, followed by photoresist strip and seed layer etching. Second insulation layer 74 is next formed, followed by formation of the center tap lead 76, insulation layer 78, coil 68, insulation 80 and top magnetic bar 82. During the formation of the coils 66, 68 and center tap element 76, apertures 70, 72 and 77 are etched to provide a central opening for accommodating the central region 84 of top bar 82. In addition, apertures are formed in insulation layers 74, 78 in order to provide ohmic contact between the center tap element 76 and the inner end of coils 66, 68. After the formation of the top pole 82 to a thickness on the order of about 0.1 micron, a protective layer such as alumina (not illustrated) is deposited on the top of the now formed transformer to a thickness on the order of about 20 microns. The external contact pads 50, 52 and 54 are then exposed by photomask patterning and etching for wire bonding. The thin film transformer 48 is completely constructed as this stage.

As noted above, transformer 48 is used to modify the signals on the sense lead 12. More particularly, the voltage level of the signals is stepped up or boosted by transformer 48. The amount of boost in the signal level is determined by the turns ratio of the coils 66, 68. With the center tap element 76 used as the input terminal, and the end of coil 66 coupled to contact pad 50 used as common; and the end of coil 68 coupled to contact pad 54 used as the output terminal, the number of turns $N_1$ on the signal input side will be simply the number of turns in coil 66, while the number of turns on the signal output side will be the combined value of the number of turns in coil 66 and coil 68. These numerical values can be determined in an empirical fashion for a given application.

The fabrication of the thin film transformer 48 may be done simultaneously with the thin film magnetic core element 2 to form a built in or integrated signal amplifier. Alternatively, transformer 48 may be independently fabricated and added to the thin film magnetic core 2 as an add-on signal amplifier. Transformer 48 may also be used independent of the memory core elements 2 as a device for modification of low level signals at the integrated circuit level.

FIG. 10 illustrates the physical connections between the transformer 48 and the sense line 12 of a core memory array. As seen in this FIG., the sense contact pad 22 is coupled by means of a suitable conductive path 90 to external contact pad 50, which is coupled to the outer lead of the lowermost coil 66. The other sense line contact pad 24 is coupled to the external center lead pad 52 via a conductive path 92. The outer lead of the uppermost coil 68 is coupled to a signal output terminal contact pad 100 via a conductive path 94. The amplified signal is output between the extension pad 98, 100 of the external contact pads 50, 54 of the first coil 66 and the second coil 68.

After complete integration of the thin film core memory system and the thin film transformer 48, contact pins are then bonded to all external contact pads on the bottom substrate of the thin film system. The completed device is then encapsulated in plastic or ceramic with the contact pins exposed in the well known IC package configuration.

As will now be apparent, thin film magnetic core memory arrays fabricated in accordance wi&h the teachings of the invention offer several advantages over known disk drive mass storage devices, thin film memory arrays and arrays of magnetoresistive memory elements. In particular, since the physical dimensions of the individual memory elements are relatively small, memory arrays can be constructed which have relatively high bit capacity compared to disk drive units. For example, it is estimated that a 1 megabit array can be constructed with physical dimensions of no more than two inches by two inches. In addition, the access time of memory arrays fabricated in accordance with the invention is on the order of a few nanoseconds, which is approximately 3 orders of magnitude faster than the seek time for typical disk drives in use today. Also, the power consumption is substantially below that required for disk drives and discrete core memory arrays. Further, due to the closed magnetic paths employed, the problem of cross field interaction and inhomogeneity of the film encountered in thin film memory elements is alleviated, and the long term non-volatility of the bit storage is exceedingly reliable. In addition, because the arrays can be fabricated using integrated circuit fabrication techniques, great economies of scale can be achieved, so that the individual memory arrays can be produced at a favorably low cost with relatively high yield. Lastly, the use of the thin film transformer enables extremely small size core memory elements to be used and thus small power consumption, without sacrificing signal integrity.

While the above provides a complete and adequate description of the preferred embodiments cf the invention, various modifications, alternate constructions and equivalents will occur to those skilled in the art. For example, other dimensions than the representative dimensions given above can be chosen in accordance with specific application requirements. In addition, if the transformer 48 has poles 60, 82 fabricated from a material which is a good ohmic conductor (such as nickel-iron), one or both of the poles can provide the center tap connection and center tap element 76 can be omitted. Also, the memory arrays need not be stacked vertically in order to provide a vertical 3-dimensional memory: this can be achieved by electrical interconnections. Therefore, the above should not be construed as limiting the invention, which is defined by the appended claims.

What is claimed is:

1. A thin film magnetic memory element comprising;
   a substrate;
   a base pole member supported by said substrate;
   a top pole member forming a closed magnetic path with said base pole member, said base and top pole members fabricated of a magnetically permeable material;
   a plurality of electrically conductive leads passing through the interior of said magnetic path said plurality comprising a first pair of substantially mutually parallel leads and a second pair of substantially mutually parallel leads; and
   means for electrically insulating said leads from each other and from said base and top pole members, one of said first pair of substantially mutually parallel leads serving as a SENSE lead for the memory element, one of said second pair of substantially mutually parallel leads serving as a common current lead for the memory element, and other ones of said plurality of electrically conductive leads serving to enable addressing of the memory element.

2. The memory element of claim 1 wherein said first pair of leads is arranged at an angle with respect to said second pair of leads.

3. The memory element of claim 1 wherein said substrate is magnetically non-conductive.

4. The memory element of claim 1 further including an electrically insulative layer formed over said memory element.

5. A magnetic memory array comprising:
   a substrate;
   a plurality of thin film magnetic memory cores arranged in an array over said substrate, each said thin film magnetic memory core comprising a bottom pole member supported by said substrate and a top pole member forming a closed magnetic path with said bottom pole member, said bottom and top pole members fabricated of a magnetically permeable material;
   a first electrically conductive lead reeving through each of said magnetic memory cores and serving as a SENSE lead for the array;
   a second electrically conductive lead reeving through each of said magnetic memory cores and serving as a common current lead for the array;
   a first plurality of electrically conductive leads, each lead of said first plurality reeving through a plurality of cores associated with that lead to define a row array of cores, said first plurality of leads and the associated cores collectively defining a corresponding plurality of row core arrays;
   a second plurality of electric ally conductive leads, each lead of said second plurality reeving through a plurality of cores associated with that lead to define a column array of cores, said second plurality of leads and the associated cores collectively defining a corresponding plurality of column core arrays; and
   said first and second plurality of electrically conductive leads serving to enable individual addressing of said cores; and
   means for insulating said leads from each other and from said cores.

6. The memory array of claim 5 wherein said first plurality of leads are mutually parallel and said second plurality of leads are mutually parallel and arranged at an angle with respect to said first plurality of leads.

7. The memory array of claim 6 wherein said first lead is substantially parallel to said first plurality of leads, and said second lead is substantially parallel to said second plurality of leads.

8. The memory array of claim 5 further including a plurality of contact pads carried by said substrate, and wherein each of said leads has a first end coupled to one of said pads and a second end coupled to another one of said pads.

9. The memory array of claim 5 wherein a plurality of said magnetic memory arrays are intercoupled to form a three dimensional array.

10. The memory array of claim 5 further including an electrically insulative layer covering said array.

11. A miniature thin film transformer comprising:
    a thin film bottom pole member;
    a thin film top pole member forming a closed magnetic path with said bottom pole member, said top and bottom pole members fabricated of a magnetically permeable material;
    first and second mutually spaced electrically conductive coils positioned between said top and bottom pole members, each of said coils having an externally accessible end; and
    means for electrically insulating said coils from said pole members.

12. The transformer of claim 11 wherein said pole members are mutually coupled at opposing ends and centrally thereof.

13. The transformer of claim 12 wherein said pole members are mutually coupled centrally by means of a centrally arranged portion of one of said pole members extending to the other one of said pole members.

14. The transformer of claim 11 wherein said bottom pole member has first and second end portions and an intermediate body potion extending therebetween; and wherein
    said top pole member has first and second end portions and an intermediate body portion extending therebetween and disposed above the intermediate body portion of said bottom pole member to provide an interior space for accommodating said coils, said first and second end portions of said bottom pole member being coupled to said first and second end portions of said top pole member, respectively.

15. In combination:
a magnetic memory array comprising:
a substrate;
a plurality of thin film magnetic memory cores arranged in an array over said substrate, each said thin film magnetic memory core comprising a bottom pole member supported by said substrate and a top pole member forming a closed magnetic path with said bottom pole member, said bottom and top pole members fabricated of a magnetically permeable material;
a first electrically conductive lead reeving through each of said magnetic memory cores and serving as a SENSE lead for the array;
a second electrically conductive lead reeving through each of said magnetic memory cores and serving as a common current lead for the array;
a first plurality of electrically conductive leads, each lead of said first plurality reeving through a plurality of cores associated with that lead to define a row array of cores, said first plurality of leads and the associated cores collectively defining a corresponding plurality of row core arrays;
a second plurality of electrically conductive leads, each lead of said second plurality reeving through a plurality of cores associated with that lead to define a column array of cores, said second plurality of leads and the associated cores collectively defining a corresponding plurality of column core arrays; said first and second plurality of electrically conductive leads serving to enable individual addressing of said cores; and
means for insulating said leads from each other and from said cores; and
a miniature thin film transformer comprising:
a bottom pole member;
a top pole member forming a closed magnetic path with said bottom pole member, said top and bottom pole members fabricated of a magnetically permeable material; and
first and second mutually spaced electrically conductive coils positioned between said top and bottom pole members, each of said coils having an externally accessible end, one of said coils being electrically coupled to said first electrically conductive lead.

16. The combination of claim 15 wherein said first plurality of leads are mutually parallel and said second plurality of leads are mutually parallel and arranged at an angle with respect to said first plurality of leads.

17. The combination of claim 16 wherein said first lead is substantially parallel to said first plurality of leads, and said second lead is substantially parallel to said second plurality of leads.

18. The combination of claim 15 further including a plurality of contact pads carried by said substrate, and wherein each of said leads has a first end coupled to one of said pads and a second end coupled to another one of said pads.

19. The combination of claim 15 wherein a plurality of said magnetic memory arrays are intercoupled to form a three dimensional array.

20. The combination of claim 15 further including an electrically insulative layer covering said array.

21. The combination of claim 15 wherein said transformer pole members are mutually coupled at opposing ends and centrally thereof.

22. The combination of claim 21 wherein said transformer pole members are mutually coupled centrally by means of a centrally arranged portion of one of said transformer pole members extending to the other one of said transformer pole members.

23. The combination of claim 15 wherein said bottom transformer pole member has first and second end portions and an intermediate body portion extending therebetween;
said top transformer pole member has first and second end portions and an intermediate body portion extending therebetween and disposed above the intermediate body portion of said first transformer bottom pole member to provide an interior space for accommodating said coils, said first and second end portions of said bottom transformer pole member being coupled to said first and second end portions of said top transformer pole member, respectively.

24. The combination of claim 23 wherein said intermediate body portion of said top transformer pole member has a downwardly depending central portion extending to said intermediate body portion of said bottom transformer pole member.

25. The combination of claim 24 wherein each of said first and second coils is disposed about said central portion of said top transformer pole member at locations spaced there along.

26. A miniature thin film transformer comprising:
a thin film bottom pole member having first and second end portions and an intermediate body portion extending therebetween;
a thin film top pole member forming a closed magnetic path with said thin film bottom pole member, said top and bottom pole members fabricated of a magnetically permeable material;
first and second mutually spaced electrically conductive coils positioned between said top and bottom pole members, each of said coils having an externally accessible end, said top pole member having first and second end portions and an intermediate body portion extending therebetween and disposed above the intermediate body portion of said bottom pole member to provide an interior space for accommodating said coils, said first and second end portions of said bottom pole member being coupled to said first and second end portions of said top pole member, respectively; and
means for electrically insulating said coils from said pole members.

27. The transformer of claim 26 wherein said interior body portion of said top pole member has a downwardly depending central portion extending to said intermediate body portion of said bottom pole member.

28. The transformer of claim 27 wherein each of said first and second coils is disposed about said central portion of said top pole member at locations spaced there along.

29. An addressable thin film magnetic memory device comprising:
a substrate;
a magnetic memory cell carried by said substrate, said cell including: a thin film base pole member supported by said substrate; and a thin film top pole member forming a closed magnetic path with said thin film base pole member, said thin film base and top pole members fabricated of a magnetically permeable material, said closed magnetic path having two alternative magnetic states to provide a binary storage capability; and means for enabling said magnetic memory cell to be directly addressed by remote interrogation signals, said enabling means including a plurality of electrically conductive leads passing through the interior of said magnetic path, some of said plurality of leads serving as address leads for said magnetic memory cell.

30. The device of claim 29 wherein one of said plurality of leads serves as a sense lead for said magnetic memory cell.

31. The device of claim 29 further including a plurality of said magnetic memory cells located on said substrate in an array pattern, and wherein said enabling means is coupled to said plurality of magnetic memory cells in order to permit individual ones of said cells to be directly addressed by remote interrogation signals.

32. A thin film transformer assembly comprising:
a substrate providing a support surface; and
a thin film transformer carried by said support surface, said thin film transformer comprising a thin film bottom pole member, a thin film top pole member forming a closed magnetic path with said bottom pole member, said top and bottom pole members being fabricated of a magnetically permeable material, and an electrically conductive coil positioned between said top and bottom pole members, said coil having a pair of ends and a tap connection between said ends.

33. The transformer of claim 32 wherein said pole members are mutually coupled at opposing ends and centrally thereof.

34. The invention of claim 33 wherein said pole members are mutually coupled centrally by means of a centrally arranged portion of one of said pole members extending to the other one of said pole members.

35. The invention of claim 32 wherein said bottom pole member has firstly and second end portions and an intermediate body portion extending therebetween; and wherein said top pole member has first and second end portions and an intermediate body portion extending therebetween and disposed above the intermediate body portion of said bottom pole member to provide an interior space for accommodating said coil, said first and second end portions of said bottom pole member being coupled to said first and second end portions of said top pole member, respectively.

36. The invention of claim 35 wherein said intermediate body portion of said top pole member has a downwardly depending central portion extending to said intermediate body portion of said bottom pole member.

37. The invention of claim 36 wherein said coil is disposed about said central portion of said top pole member.

38. The invention of claim 32 wherein at least one of said pole members is electrically conductive; and wherein one of said coil ends is electrically coupled to said electrically conductive pole member.

39. The invention of claim 32 wherein said top connection includes a tap element having an externally accessible end portion.

* * * * *